(12) United States Patent
Bantas et al.

(10) Patent No.: US 9,740,810 B2
(45) Date of Patent: *Aug. 22, 2017

(54) EXPERT SYSTEM-BASED INTEGRATED INDUCTOR SYNTHESIS AND OPTIMIZATION

(71) Applicant: HELIC S.A., Athens (GR)

(72) Inventors: Sotirios Bantas, Athens (GR); Paschalis Zampoukis, Athens (GR)

(73) Assignee: HELIC S.A., Athens (GR)

( * ) Notice: Subject to any disclaimer, the term of this patent is extended or adjusted under 35 U.S.C. 154(b) by 0 days.

This patent is subject to a terminal disclaimer.

(21) Appl. No.: 14/884,651

(22) Filed: Oct. 15, 2015

(65) Prior Publication Data

US 2016/0034626 A1 Feb. 4, 2016

Related U.S. Application Data

(63) Continuation of application No. 14/276,734, filed on May 13, 2014, now Pat. No. 9,171,118, which is a (Continued)

(30) Foreign Application Priority Data

Oct. 7, 2008 (GB) .................................. 0818308.9

(51) Int. Cl.
*G06F 17/50* (2006.01)
*H04W 40/00* (2009.01)
*H04L 12/721* (2013.01)

(52) U.S. Cl.
CPC ........ *G06F 17/5068* (2013.01); *H04L 45/124* (2013.01); *H04W 40/00* (2013.01)

(58) Field of Classification Search
CPC ............. G06F 11/3447; G06F 17/5036; G06F 17/5045; G06F 17/5009; G06F 17/5068; G06F 2217/06; G06F 2217/63
(Continued)

(56) References Cited

U.S. PATENT DOCUMENTS 6,907,589 B2 6/2005 Frank et al.
7,082,584 B2 7/2006 Lahner et al.
(Continued)

OTHER PUBLICATIONS

Office Action in U.S. Appl. No. 12/575,410, mailed Nov. 26, 2013, 11 pages.
(Continued)

*Primary Examiner* — Paul Dinh
(74) *Attorney, Agent, or Firm* — Nixon Peabody, LLP; Khaled Shami

(57) ABSTRACT

A system and method for designing an electrical component comprises a model extraction engine configured to generate a model based on a set of parameters, a simulator configured to simulate the generated model and measure performance, a rule-set usable to determine changes to the set of parameters, and an inference engine configured to change salience values of expert rules included in the rule set. The salience value determines when and if an expert rule is used to change the set of parameters. One or more microprocessors are configured to determine design characteristics of the electrical component by iteratively performing, until measured performance is within tolerance, the steps of generating a model based on an updated version of the set of parameters, simulating the generated model, measuring performance of the generated model, and updating the set of parameters using the rule-set if the measured performance is not within the predefined tolerance.

12 Claims, 13 Drawing Sheets

Related U.S. Application Data continuation of application No. 12/575,410, filed on Oct. 7, 2009, now Pat. No. 8,769,447.

(58) Field of Classification Search
USPC ........ 716/100, 104, 106, 122, 132–134, 136
See application file for complete search history.

(56) References Cited

U.S. PATENT DOCUMENTS

| | | |
|---|---|---|
| 7,383,521 B2 | 6/2008 | Smith et al. |
| 7,395,129 B2 | 7/2008 | Yamazaki et al. |
| 7,406,475 B2 | 7/2008 | Dorne et al. |
| 7,536,664 B2 | 5/2009 | Cohn et al. |
| 7,571,405 B1 | 8/2009 | Aik |
| 7,627,837 B2 | 12/2009 | Zhang |
| 7,673,278 B2 | 3/2010 | Rathsack et al. |
| 8,625,785 B2 | 1/2014 | Nagaraja |
| 8,769,447 B2 | 7/2014 | Bantas et al. |
| 9,171,118 B2 | 10/2015 | Bantas et al. |
| 2002/0188925 A1 | 12/2002 | Higashi |
| 2003/0229875 A1 | 12/2003 | Smith et al. |
| 2004/0049479 A1 | 3/2004 | Dorne et al. |
| 2004/0163054 A1 | 8/2004 | Frank |
| 2004/0221249 A1 | 11/2004 | Lahner et al. |
| 2005/0132306 A1 | 6/2005 | Smith |
| 2005/0257178 A1 | 11/2005 | Daems et al. |
| 2006/0036977 A1 | 2/2006 | Cohn et al. |
| 2006/0052893 A1 | 3/2006 | Yamazaki et al. |
| 2006/0085772 A1 | 4/2006 | Zhang |
| 2008/0243912 A1 | 10/2008 | Azvine et al. |
| 2009/0144691 A1 | 6/2009 | Rathsack |
| 2009/0287930 A1 | 11/2009 | Nagaraja |
| 2010/0088657 A1 | 4/2010 | Bantas et al. |
| 2013/0339918 A1* | 12/2013 | Clark .................. G06F 17/5072 716/122 |
| 2014/0250417 A1 | 9/2014 | Bantas et al. |

OTHER PUBLICATIONS

Advisory Action in U.S. Appl. No. 12/575,410, mailed Jan. 23, 2013, 3 pages.
Office Action in U.S. Appl. No. 12/575,410, mailed Nov. 16, 2012, 7 pages.
Office Action in U.S. Appl. No. 12/575,410, mailed Jun. 1, 2012, 10 pages.
Office Action in U.S. Appl. No. 12/575,410, mailed Feb. 22, 2012, 4 pages.
Office Action in U.S. Appl. No. 14/276,734, mailed May 27, 2015, 7 pages.
Office Action in U.S. Appl. No. 14/276,734, mailed Nov. 13, 2014, 10 pages.

* cited by examiner

EXPERT SYSTEM-BASED INTEGRATED INDUCTOR SYNTHESIS AND OPTIMIZATION

CLAIM OF PRIORITY

This application is a continuation of U.S. patent application Ser. No. 14/276,734, filed May 13, 2014; now U.S. Pat. No. 9,171,118, issued Oct. 27, 2015, which is a continuation of U.S. patent application Ser. No. 12/575,410, filed Oct. 7, 2009, now U.S. Pat. No. 8,769,447, issued Jul. 1, 2014, which claims the benefit of priority to U.K. Patent Application No. GB 0818308.9, filed Oct. 7, 2008, which applications are incorporated herein by reference.

STATEMENT REGARDING SPONSORED RESEARCH AND DEVELOPMENT

The work that led to the development of this invention, was co-financed by Hellenic Funds and by the European Regional Development Fund (ERDF) under the Hellenic National Strategic Reference Framework (NSRF) 2007-2013, according to Contract no. MICRO2-15 of the Project "Business Development Support Actions—HELIC" within the Programme "Hellenic Technology Clusters in Microelectronics—Phase-2 Aid Measure"

FIELD OF THE INVENTION

The invention relates to the field of designing inductors and inductor circuits particularly for integrated circuits (ICs). The presented methodology is applicable to non-inductive devices as well as circuits.

BACKGROUND

Designing and optimizing spiral inductors on silicon has been a painstaking and costly experience, one associated with consecutive silicon spins and several hours of wait with electromagnetic (EM) simulators. Often, the related effort cannot be ported to new silicon processes; moving to a new process with a different metal stack, minimum feature size and grid, means that any spiral optimized at the previous process node will most probably be off in the new one. Overdesign does not apply here; key spiral inductor properties such as quality factor and resonance frequency are largely dependent on parasitics, and these change irregularly between process nodes, especially in the sub-100 nm region.

A variety of methodologies and Electronic Design Automation (EDA) tools have been developed to facilitate synthesis and optimization of inductors in integrated circuits. Each one, however, comes with certain disadvantages.

The methodology of geometric programming (GP) uses a lumped-element inductor model, where each of the parameters is represented by a posynomial expression. The optimization problem with objective (inductance at operating frequency) and constraints (quality factor, self resonance frequency, area) in posynomial form is expressed as a geometric program in convex form that can be solved globally. The major disadvantage of this method is that it requires prior knowledge of the mathematical expressions relating each geometric parameter to inductor performance; this cannot be achieved fully or is impractical in the context of modern silicon processes, where multiple design and manufacturing parameters come into play in the fabrication of an integrated inductor. For instance, there exists no known mathematical formula for relating inductor quality factor to the number and properties of metal layers that can be stacked to construct the inductor's tracks.

Some methodologies in the prior art synthesize and optimize inductors based on 'trained' equivalent lumped-element inductor models. Models are trained using either measurements or simulation results that come from full-wave EM solvers or quasi-static EM solvers. The accuracy of the methodology strongly depends on the accuracy of the measurements or simulation results and on the type of the lumped-element model. A major drawback of this approach is that the model should be separately trained for each manufacturing process or process node and is not globally valid for all processes. This leads to increased setup times, poor re-usability between silicon processes, and other inefficiencies.

Other methodologies rely on physical lumped-element inductor models for the synthesis and optimization procedure. The lumped element values are computed from analytic expressions derived from the underlying physics and parameters related to the process, while measured data are only used for validation. For every process several thousands of geometries are modeled and simulated. The geometric parameters and the simulation results are stored in a database. The synthesis and optimization tool retrieves from the database and delivers the optimal geometry that satisfies the objective and constraints of the problem. The method is fast; its accuracy however depends on the accuracy of the model and the size of the database. Also, this method is by definition not re-useable between processes.

SUMMARY

Embodiments of the invention seek to avoid or at least mitigate problems in the prior art.

Embodiments of the invention also provide a method of optimizing the design of an electrical component or circuit for an integrated circuit. Other aspects and features of the invention are set out in the specification and claims.

Embodiments of the invention include an expert system-based methodology for fast synthesis and efficient optimization of integrated spiral inductors, that sets out to mitigate at least some of the above disadvantages. Using heuristic methods that can be captured in a rule set, in accordance with an embodiment, spiral inductors may be synthesized that satisfy user-defined constraints, such as inductance (L) and quality factor (Q) at a given operating frequency, maximum size and others. The methodology employed is independent of the manufacturing process used to design the inductors. In this way, no setup or customization is needed for a new process design kit and may resolve any inductor synthesis problem in a rapid manner.

In accordance with an embodiment, the inductor synthesis system is capable of self-learning and can adapt to various process parameters and design parameters, by means of self-adjusting the relative importance of the rules stored in its rule set. Circuit simulation is employed by the methodology to verify the electrical performance of synthesized inductor geometries and achieve accuracy; however, in accordance with an embodiment, simulation is preferably used sparingly and therefore the system operates fast. The aforementioned merits seek to mitigate the aforementioned problems of the prior art, though other aspects of the invention will become apparent from the description and claims.

Although the invention is developed primarily for solving the problem of integrated spiral inductor synthesis and optimization, those skilled in the art will realize that it can be extended and applied to the synthesis and optimization of other types of devices and even circuits.

BRIEF DESCRIPTION OF THE DRAWINGS

Embodiments of the invention will now be described, by way of example only, with reference to the accompanying drawings in which.

DETAILED DESCRIPTION

In accordance with an embodiment, an expert system-based inductor synthesis system comprises the following modules:
  A Model Extraction Engine, which creates a model for an under-test candidate spiral geometry.
  A Simulator, which simulates the model and measures the parameters needed by the expert system.
  The rule set, which encapsulates expert knowledge for processing the information received from simulations and inferring the next candidate geometry that should be tested.
  Components of a software-based expert system, such as an Inference Engine.
  Preferably, a user interface for communicating with the user.

Figure 1:
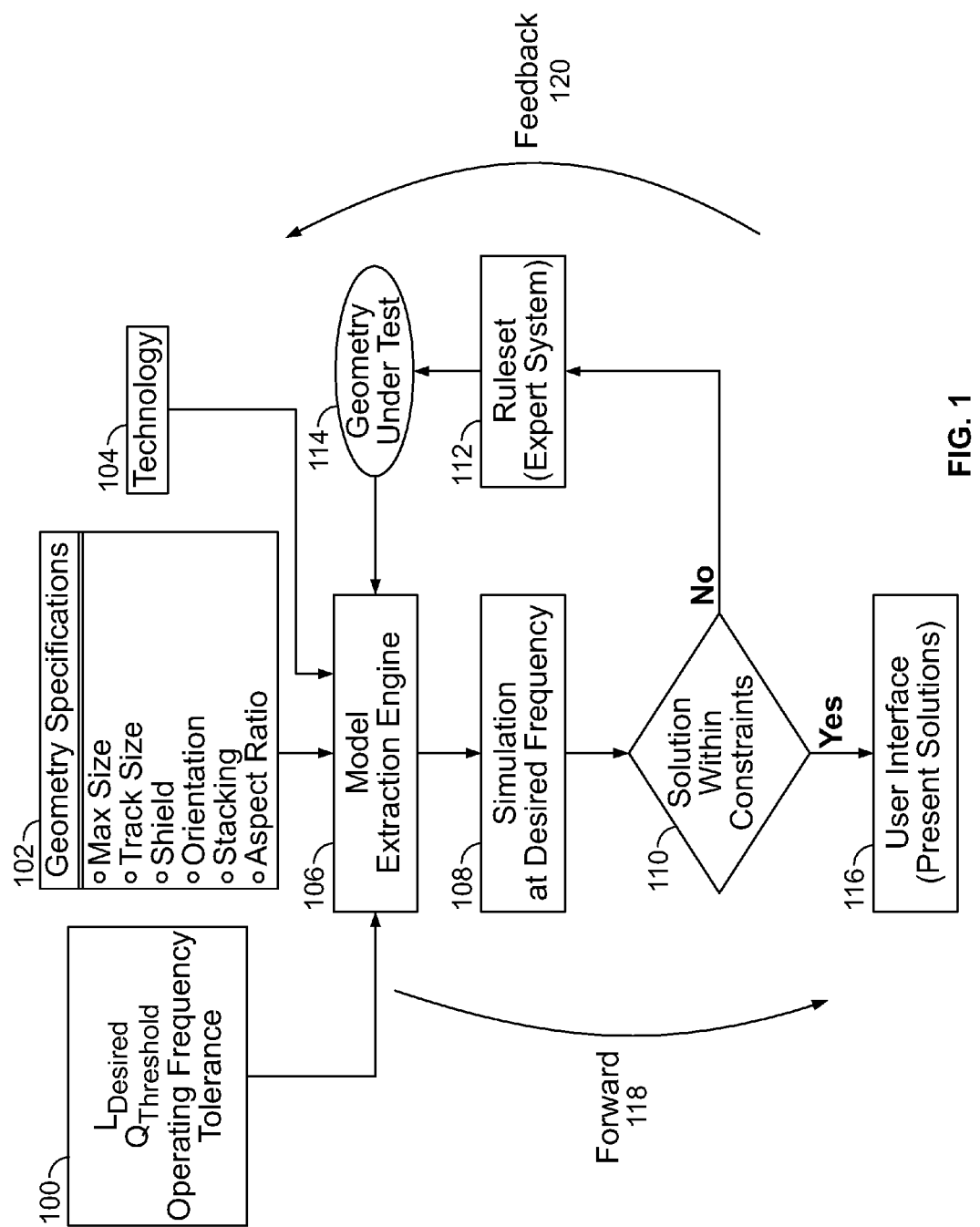
FIG. 1 shows a high level data flow diagram of the synthesis methodology, in accordance with an embodiment.

FIG. 1 shows a high level data flow diagram of the synthesis methodology, in accordance with an embodiment. FIG. 1 includes: operating frequency tolerance performance parameters 100; geometry specifications 102; technology parameters 104; model extraction engine 106; simulation 108; checking if the solution is within pre-specified constraints 110; a rule set 112; a geometry under test 114 and a graphical user interface (GUI) 116.

In accordance with an embodiment, the knowledge and experience collected from several tests and optimization runs can be captured in the rule set 112. The rules comprising the rule set 112 are graded by means of an importance (or salience) value. A mechanism is provided for promoting or demoting the salience of specific rules in the rule set, according to their efficiency—as proven by simulation—in generating good candidate solutions for a given synthesis problem.

In accordance with an embodiment, the synthesis process may take the following inputs, including:
  Geometry parameters 102 and constraints: maximum size, track size, relative orientation of bridge segments, shield on/off, aspect ratio and stacking options.
  Performance parameters 100: inductance (L, in nH), quality factor (Q) or parallel resistance (Rp) optimization at a desired operating frequency (f, in GHz).
  Technology parameters 104: Silicon technology parameters for the specific process design kit.

In FIG. 1, the flow in accordance with an embodiment includes two branches, forward 118 and feedback 120. In accordance with an embodiment, the system can be used to design spiral inductors that satisfy both geometric and performance specifications. In the forward (direct) path, the system takes as input a spiral geometry 114 and returns as output the results of a simulation 108, e.g. AC simulation using SPICE. In accordance with an embodiment, the output from simulation can be used to determine how close the candidate geometry 114 is in meeting specifications and constraints 102. An appropriate cost function is computed to accomplish this. If a better solution is required, in the feedback path the rule set 112 is triggered to restart the procedure by generating a new candidate geometry. In accordance with an embodiment, the rule set 112 encapsulates appropriate heuristics (compiled as 'expert' knowledge) to generate a new candidate solution that may lead to a better solution, or at least free the system from a local maximum or similar dead-end. This loop continues within a predefined number of iterations and/or timeframe.

The rule set can be written in a programming language suitable for expert system design, preferably CLIPS (C Language Integrated Production System). In an embodiment of the invention, the remaining elements of the flow (such as the Model Extraction 106 and Simulation 108 engines) can be written in other languages and interface to the CLIPS code.

Figure 2:
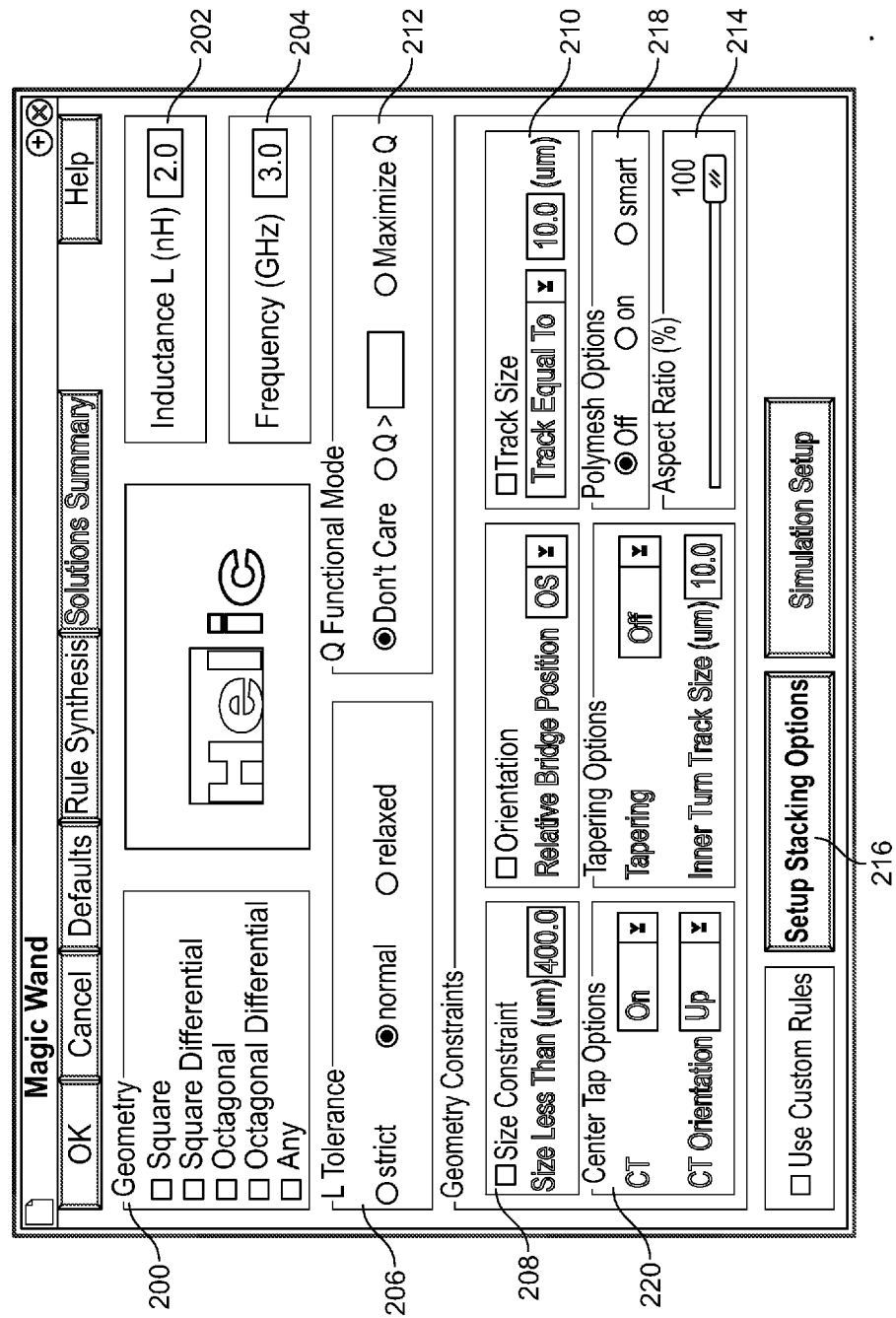
FIG. 2 shows a screen shot of a Graphical User Interface (GUI), in accordance with an embodiment.

FIG. 2 shows a screen shot of a Graphical User Interface (GUI), in accordance with an embodiment. Preferably, a graphical user interface (GUI), such as the one illustrated in FIG. 2, may be offered for accessing the system for the purposes of designing and optimizing spiral inductors. The fields of an example GUI are described below:
  The user defines the desired spiral geometry 200 (e.g. Square spiral). In the case of Differential spirals the user may select whether the spiral should have the Centre Tap ON or OFF (220).
  The user sets the desired synthesis and optimization parameters of the requested inductor. More specifically the user inputs:
    Inductance L 202: target inductance at operating frequency (in nH);
    Frequency 204: Operating frequency of the inductor (in GHz);
    L Tolerance 206: Allowed deviation of the actual L value from the desired L value.
  Maximum size constraint 208: If the user activates the option, they may input the maximum dimension (μm).
  Relative position of bridge terminals:
    Terminal in opposite sides (OS);
    Terminals in perpendicular sides (PS);
    Terminals on the same side (SS);
    Any relative position of the terminals (Any).

Track size constraint 210: If the option is activated, the user may select among:
  Track Equal To Value;
  Track Less Than Value;
  Track Greater Than Value.
Performance parameters to be optimized 212. The user may select:
  Don't Care: returns the spiral closest to target L and the smallest dimensions possible. No attempt to optimize Q;
  Q>: attempts to return a spiral closest to target L and quality factor Q greater than a specified value;
  Maximize Q: returns the inductor that satisfies all other constraints and has the highest possible Q factor at the operating frequency.
Aspect Ratio 214: SizeX/SizeY ratio, or ratio of horizontal over vertical dimension.
Stacking Options 216: The user may select valid stacked metal layer combinations.
PolyMesh 218: The user may also decide on using polysilicon mesh or other available shield options:
  On: PolyMesh enabled;
  Off: PolyMesh disabled;
  Smart: where the system enables the shield if and only if it improves the performance of the spiral.

Figure 3:
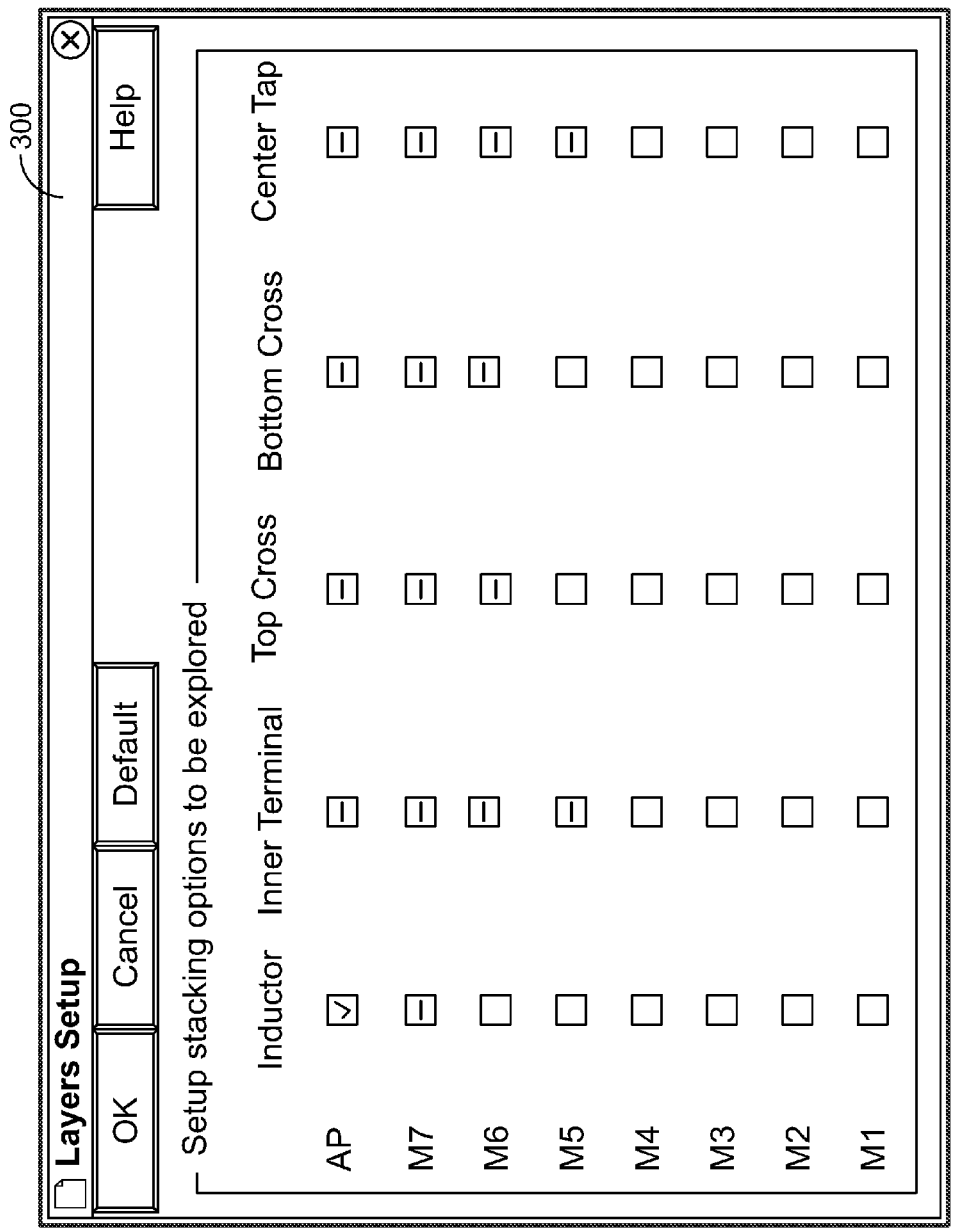
FIG. 3 shows another screen shot of a GUI in accordance with an embodiment.

FIG. 3 shows a Layer Setup form in accordance with an embodiment. A Layer Setup form 300 allows the user to define the desired layer combination for the spiral structure, as illustrated in FIG. 3. The tick (√) and dash (-) symbols are used for specifying whether a layer is to be used, or explored by the optimization process, respectively.

Figure 4:
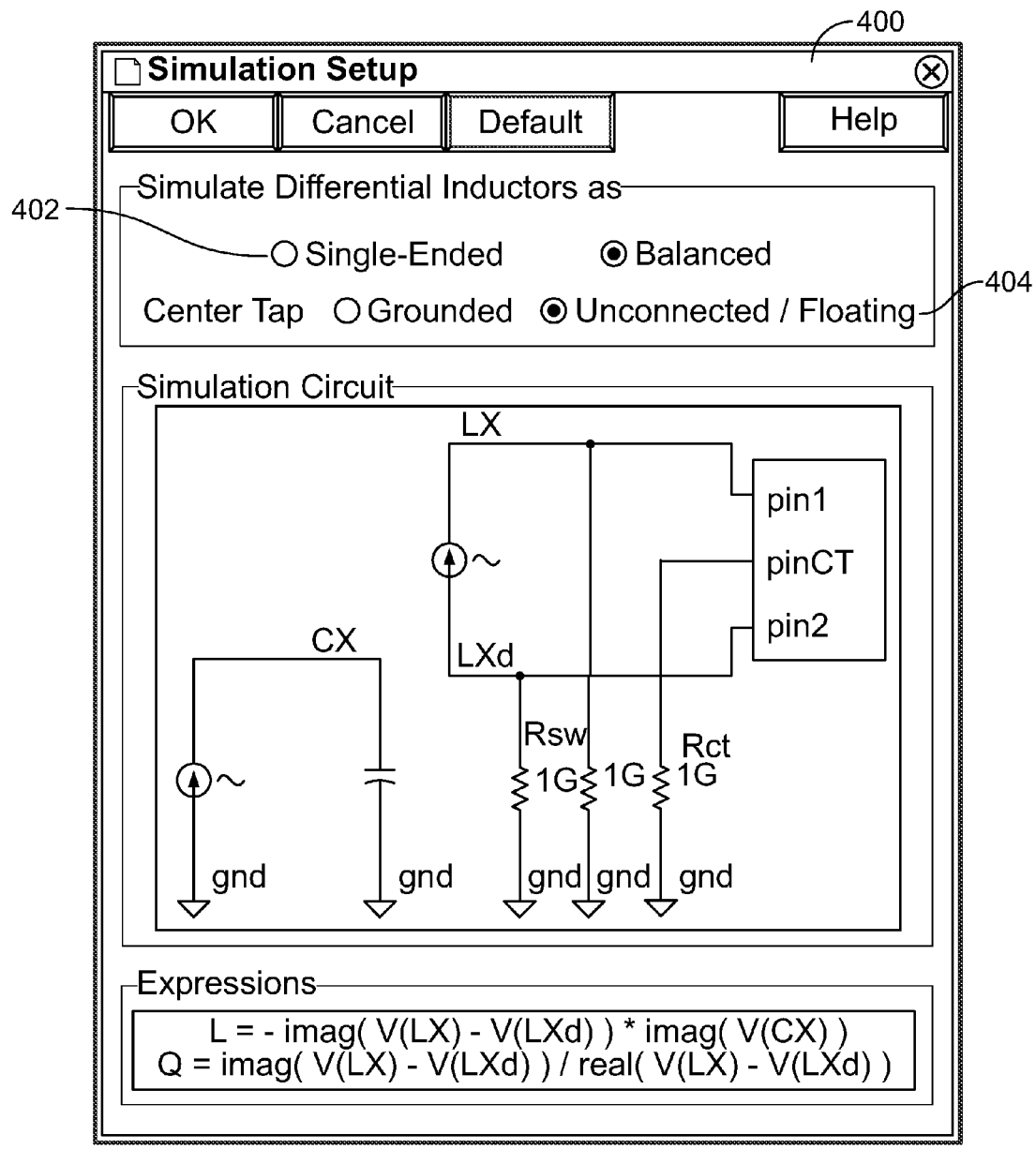
FIG. 4 shows another screen shot of a GUI in accordance with an embodiment.

FIG. 4 shows a Simulation Setup form in accordance with an embodiment. The user via this form 400 may set the simulation configuration 402 for a differential inductor, to be either Single-Ended or Balanced, and choose the connection 404 for an optional Center Tap as Grounded or Unconnected/Floating.

Figure 5A:
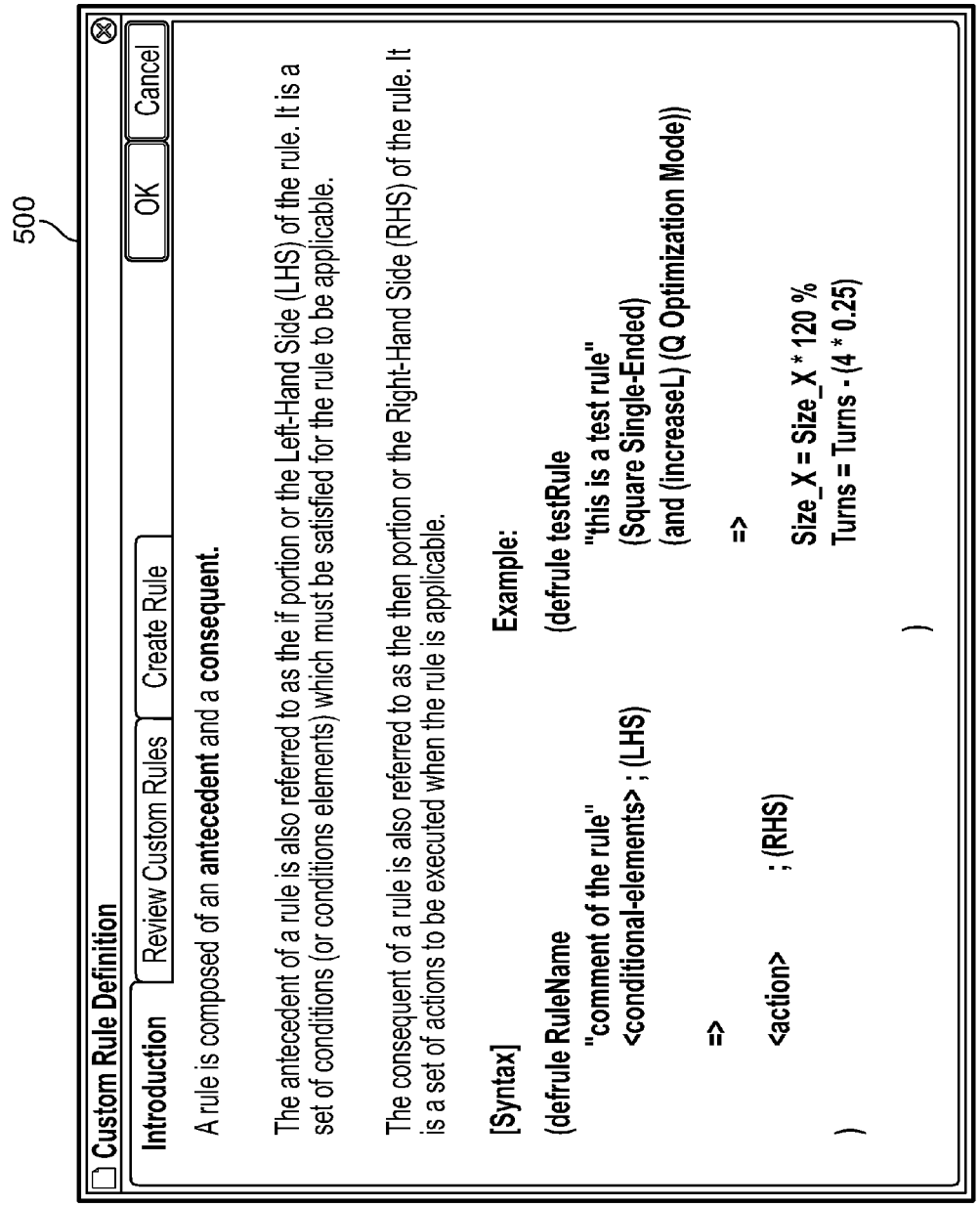
FIG. 5A shows another screen shot of a GUI in accordance with an embodiment.
Figure 5B:
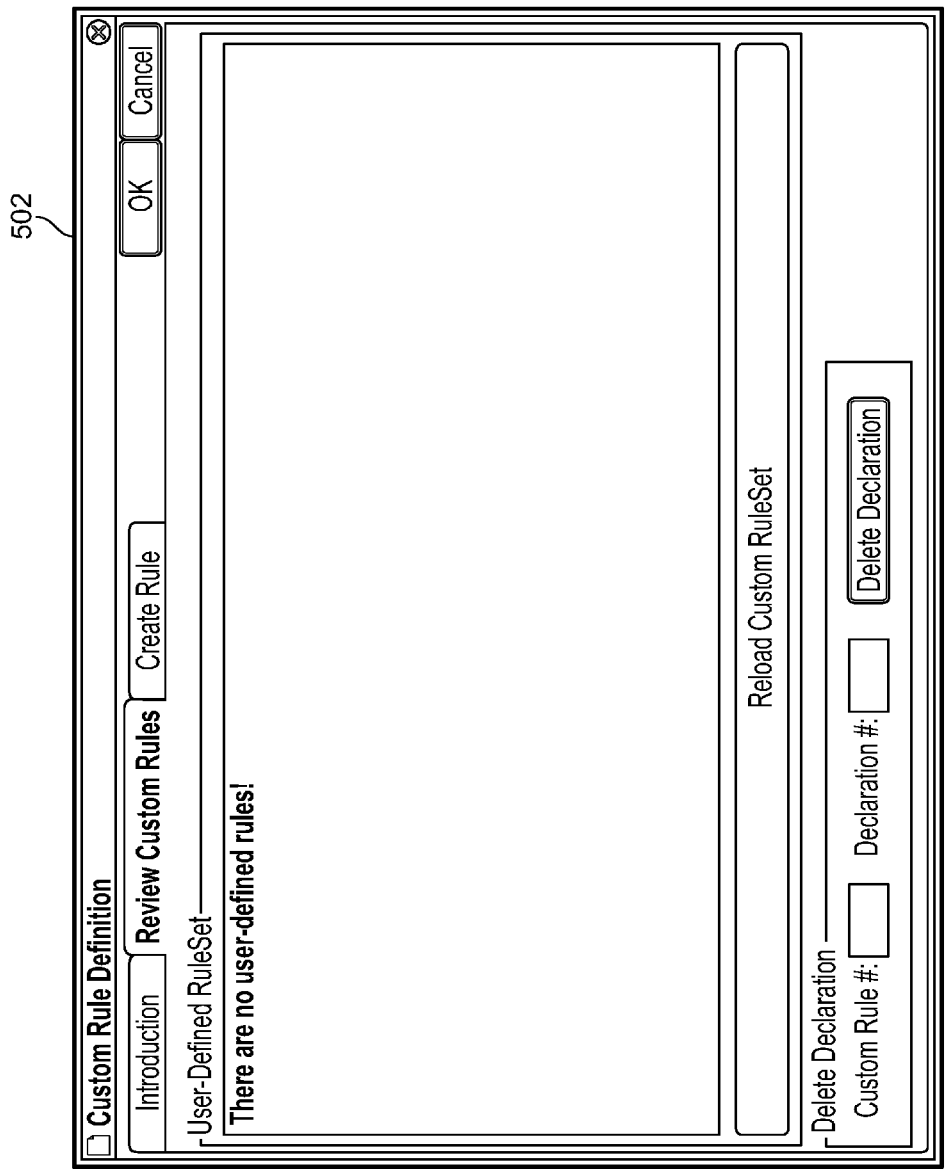
FIG. 5B shows another screen shot of a GUI in accordance with an embodiment.
Figure 5C:
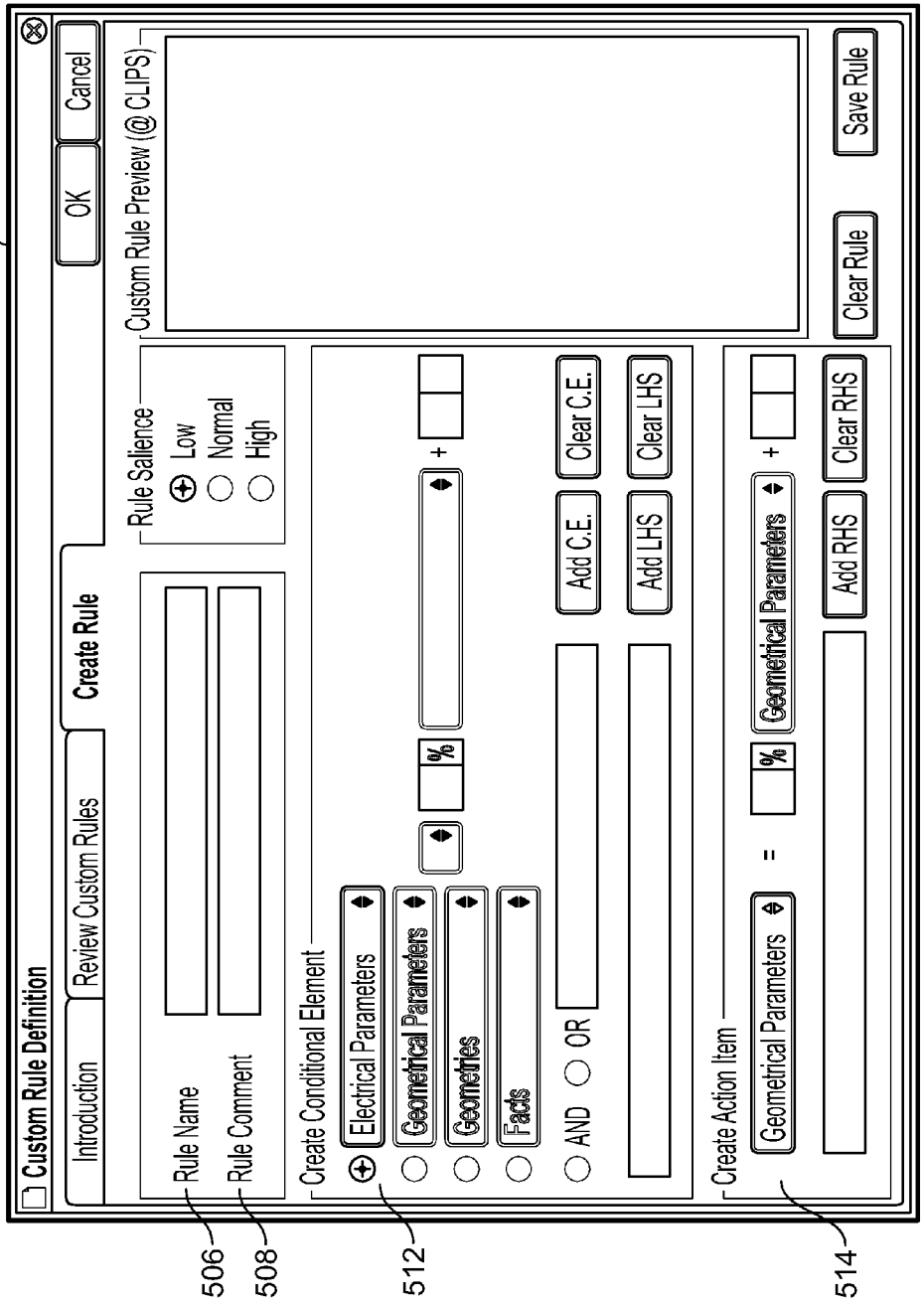
FIG. 5C shows another screen shot of a GUI in accordance with an embodiment.

FIGS. 5A-C show a Custom Rule Definition form in accordance with an embodiment. In accordance with a preferred embodiment of the invention, there is functionality that lets the user define their own rules to be inserted in the rule set for synthesis and optimization, enabling the user to embody their own expert knowledge in the system. In such case, the user may enter and activate these rules in the user interface. In an embodiment of the invention, a Custom Rule Definition form includes three frames, as illustrated in FIGS. 5a-c.

FIG. 5A shows an Introduction frame of a Custom Rule Definition form in accordance with an embodiment. The Introduction frame 500 presents briefly the structure of rules. The user becomes familiar with relevant terminology (LHS, RHS, etc.).

FIG. 5B shows a Review Custom Rules frame of a Custom Rule Definition form in accordance with an embodiment. The Review Custom Rules frame 502 presents the whole custom rule set and lets the user edit the desired custom rule.

FIG. 5C shows a Create Rule frame of a Custom Rule Definition form in accordance with an embodiment. The Create Rule frame 504 lets the user synthesize the desired design rule. In accordance with an embodiment, the user may define the following slots:
  Rule Name 506;
  Rule Comment 508,
  Salience Value 510—this value represents the priority of generated rule in reference to the rest rule set. In accordance with an embodiment, available options can include:
    1. Low, which gives the lowest priority to the custom rule;
    2. Normal, which sets as salience value the average of saliencies of rule set;
    3. High, which gives the highest priority to the custom rule.
  Conditional Elements 512—composed of an antecedent and a consequent. The antecedent of a rule is also referred to as the 'if' portion or the left-hand side (LHS) of the rule. The antecedent of a rule is a set of conditions (or conditional elements) which must be satisfied for the rule to be applicable. The user may synthesize conditions like:

<performance parameter><logical operator><a%>*<reference parameter>+<b> or
  <fact statement> where:
    <performance parameter> and <reference parameter> may be:
    1. An electrical parameter ($F_{resonance}$, $F_{target}$, $Q_{peak}$, $L_{dc}$, etc.),
    2. A geometrical parameter (SizeX, SizeY, Turns, TrackSize, etc.).
  <logical operator> may be one of the following: <, >, =, >=, <=
  <a> and <b> are constants.
    <fact statement> may be:
    1. Geometry fact statement (Square & Octagonal Single-Ended, Square & Octagonal Differential),
    2. Optimization fact (Q Optimization mode, increase of L is needed, $Q_{current}$ after $Q_{peak}$ etc.)
  and where complex logical expressions with the use of AND/OR operators may be constructed.
  Action Item 514—The action item (or list of actions) is the consequent of a rule to be executed when the rule is triggered. It is also referred to as the 'then' portion or the right-hand side (RHS) of the rule and is executed if the LHS portion is resolved to be true by the Inference Engine. According to an aspect of the invention, the user may synthesize action items like:

<geometrical parameter>=<a%>*<geometrical parameter>+<b> where:
    <geometrical parameter> may be:
    1. SizeX,
    2. SizeY,
    3. IDX,
    4. IDY,
    5. Turns,
    6. Track Size,
    7. Track Distance
  <a> and <b> are constants.

Figure 6:
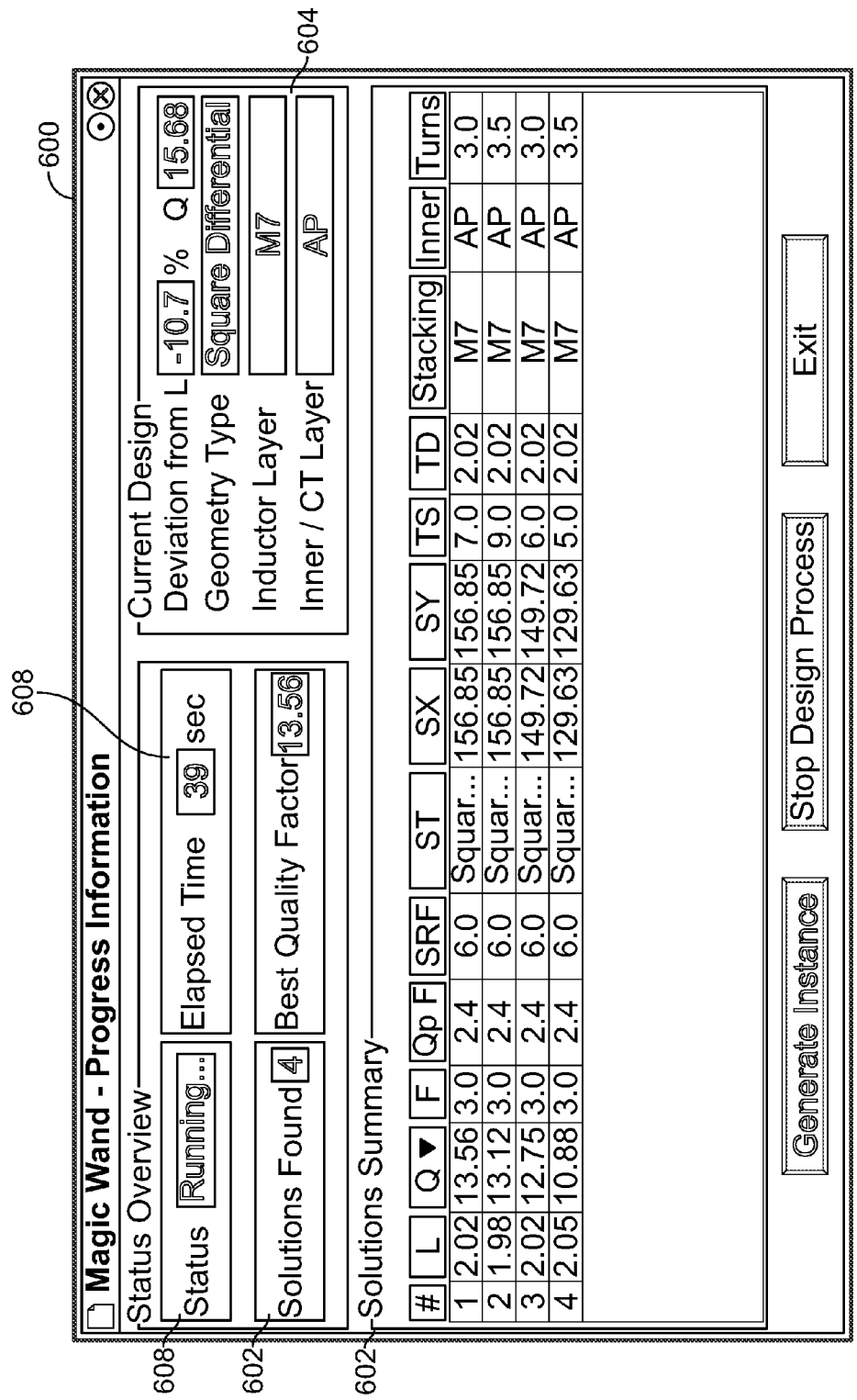
FIG. 6 shows another screen shot of a GUI in accordance with an embodiment.

FIG. 6 shows a Progress Report form in accordance with an embodiment. Preferably, the Progress Report form 600 is generated when the user triggers the search algorithm. The layout of this form is illustrated in FIG. 6. In accordance with an embodiment, in the progress report the following are provided:
  Solutions that have been found 602;
  Geometry which is currently being processed 604;
  General progress of the synthesis and optimization process 608.

In accordance with an embodiment, the rule set 112 is a component of the expert system. It comprises a knowledge base, which contains facts and rules. Facts comprise short-term information such as geometry parameters and measurements acquired from simulations during every operation cycle. The rules constitute a long-term knowledge describing how new facts are deduced from existing ones. The rules incorporate human thought and experience into the invention, thereby increasing the efficiency of human/machine interaction, such as the experience of engineers savvy in inductor design may be implemented into the system. For instance, Table 1 summarizes such experience on the dependency of L & Q on specific design parameters. The contents are translated into the expert design language, preferable CLIPS. In accordance with an embodiment, in addition to incorporating human experience, the system is also enabled of self-learning by self-adjusting the relative importance (or salience) of the various rules in this rule set 112. Rules with higher salience can execute first and more frequently. This is particularly beneficial as it is found that some rules that apply well in optimizing specific inductor values at specific frequencies, may not be so efficient or even have adverse effects for different value inductors or frequencies. In accordance with an embodiment, an inference engine is preferably used for binding rules to facts and controlling the execution of rules. Such inference engines are known in programming environments such as CLIPS.

TABLE 1

Examples of expert rules for spiral inductor optimization

| Parameter change | Effect on Inductance - L | Effect on Quality Factor - Q |
|---|---|---|
| ↑ track width | ↓ low effect (for fine tuning) | ↑ (effect is attenuated as track width increases) |
| ↑ track distance | ↓ low effect (for fine tuning) | ↓ |
| ↑ number of turns | ↑ high effect | ↓ |
| ↑ size/ diameter | ↑ high effect | ↓ |

In accordance with an embodiment, heuristic search algorithms which exploit available information may be used for intermediate stages of the solution finding process, so that non-solution-delivering paths are not followed. In accordance with an embodiment, the heuristic search algorithms therefore help increase the efficiency of the invention, by preferably identifying and rejecting non-optimal solution paths. The heuristic mechanism is preferably implemented in the form of a heuristic cost function. The value of the cost function is an indication of how close—or far off—a state is from the target value. The heuristic value does not represent the real distance from a final state, but an estimate which may be inaccurate. Additionally, if the estimate were equal to the real distance then no search would be needed, since each step of the path would be constructed deterministically. The heuristic cost function evaluates 'how good' the current state is and in order to achieve this it uses the qualitative characteristics of the 'optimal' solution. In accordance with an embodiment, an optimal solution includes:

A self inductance L value within the specified tolerance limits at the frequency of interest;

A restricted L deviation in relation to the Ldc ('dc' value of L), so that the inductance is as 'flat' as possible at the frequency of interest;

An acceptable quality factor Q value. In cases where Q optimization is applied, the value of Q must achieve the maximum possible value (i.e. global maximum) within the constraints set;

A layout area within the user constraints.

For instance, an appropriate ($C_f$) may be:

$$C_f = a/Q + b|Lcurrent - Ldc|/Ldc + c*sign(CurrentSize - MaxSize)$$

where a, b, c are constants.

In accordance with an embodiment, a search algorithm used in the invention is an improved version of the Hill-Climbing (HC) Search algorithm. The HC algorithm comprises the steps of:

1. Initial state is the current state.
2. If the state is the final one then report the solution and stop.
3. Apply the transition rules to find the children-states.
4. Find the optimal state according to the heuristic cost function.
5. If the new state is better than the current, then this state becomes the current. Go to step 2.
6. Else stop at the current state (local solution).

The HC algorithm is very efficient in terms of time and memory usage, but is also plagued with issues, which become apparent in the following metaphor: assume that the solution space is a 3D surface with hills, valleys and canyons and the highest peak is the optimal solution. The search takes place in misty conditions and hence there is no clear information on the whereabouts of the highest peak. The heuristic algorithm used is equivalent to climbing to an area higher than the current ground. This can be achieved by examining neighboring areas within visual range. The height thus of a point situated on this surface is the value of the heuristic cost function. Examining neighboring areas corresponds to creating new states. Ascending to the highest area is equivalent to choosing a state and rejecting the other states.

Figure 7:
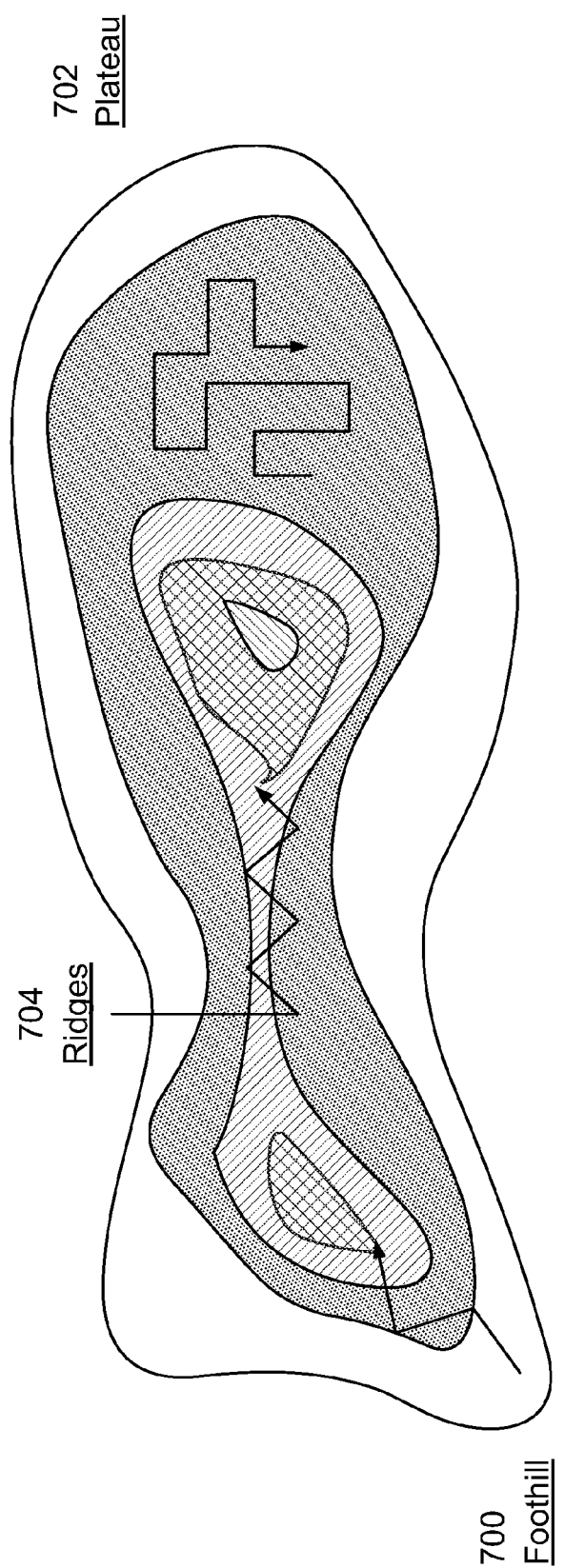
FIG. 7 shows an illustration of problems with the "hill-climber" algorithm.

FIG. 7 shows problems with the "hill-climber" algorithm. In this metaphor, three main disadvantages of the HC algorithm become apparent. These disadvantages are illustrated in FIG. 7 as features of a surface:

Foothill 700: Lower peaks may attract the search interest. Hence the solution is the local and not the global maximum.

Plateau 702: There is also the possibility of all neighboring points having exactly the same height. Selection of one of the points is thus random and wandering around the same area is inevitable.

Ridges 704: Ridges have generally high elevation and are easy to spot, but ascending to a higher peak is a slow process. There is also the possibility of the heuristic cost function value alternating between two values, i.e. the points situated on either side of the ridge, with no progress being made.

Figure 8:
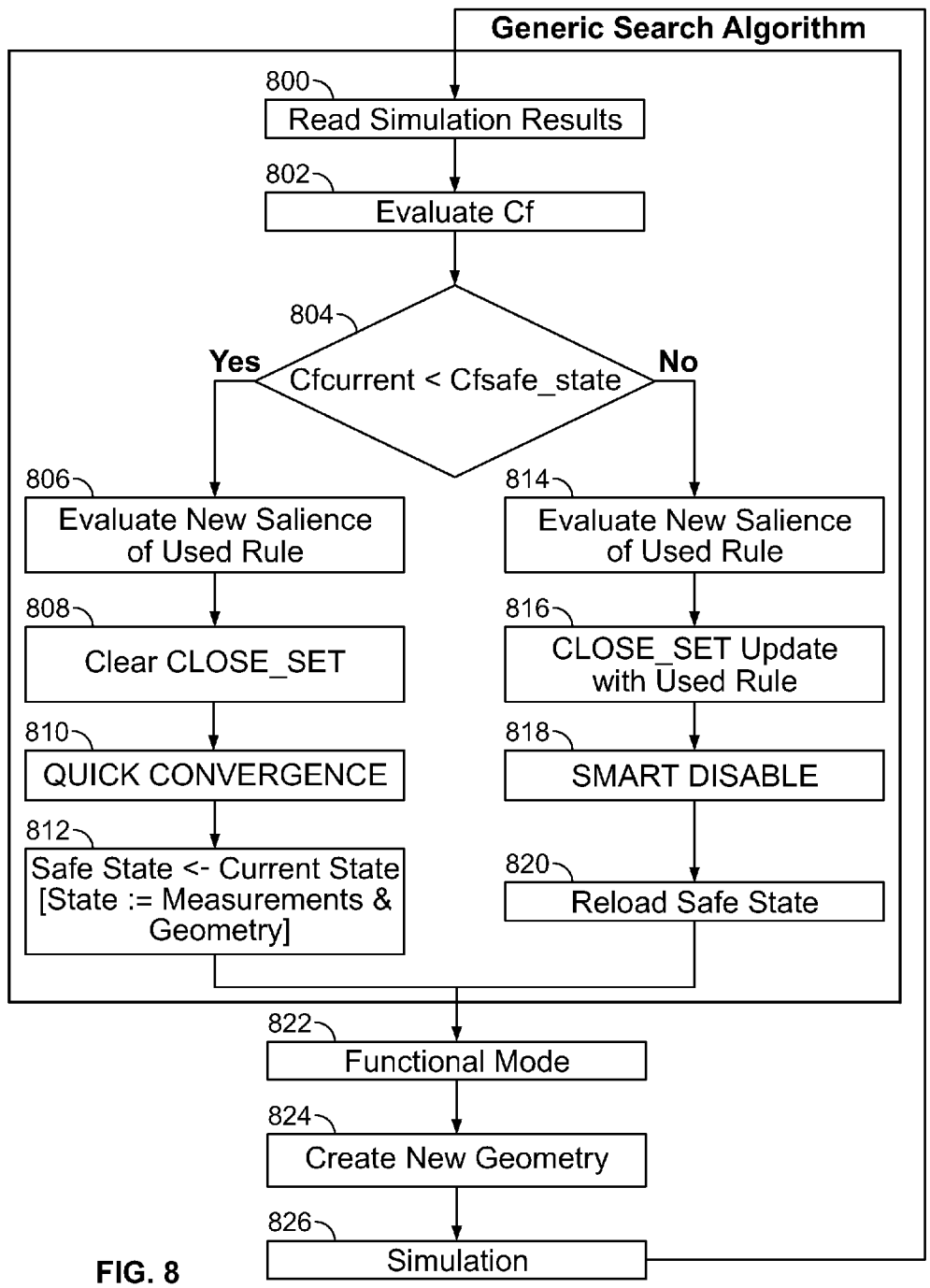
FIG. 8 is a flow chart of a search algorithm used in accordance with an embodiment.
Figure 9:
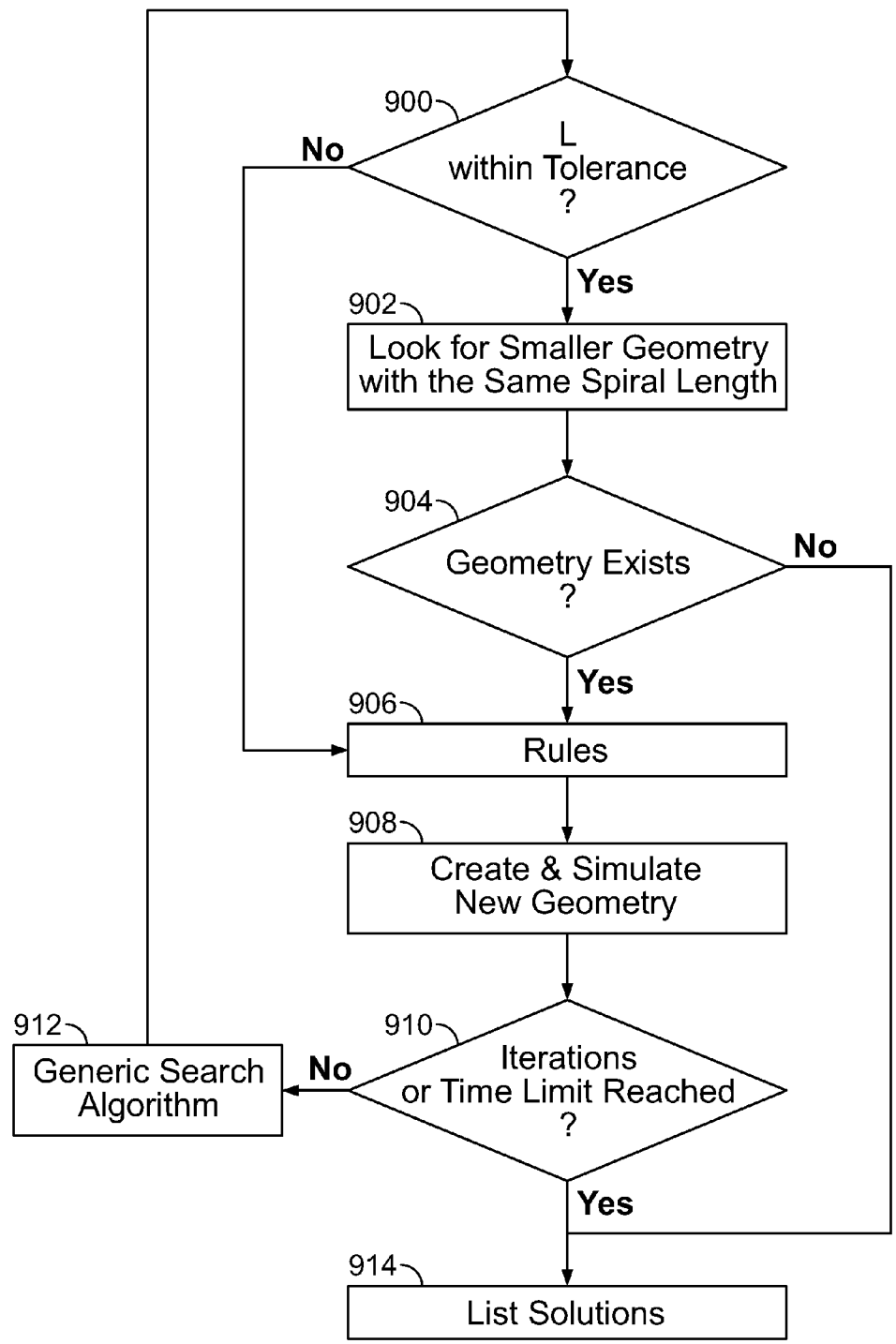
FIG. 9 is a flow chart of an algorithm of the "Don't care" mode in accordance with an embodiment.
Figure 10:
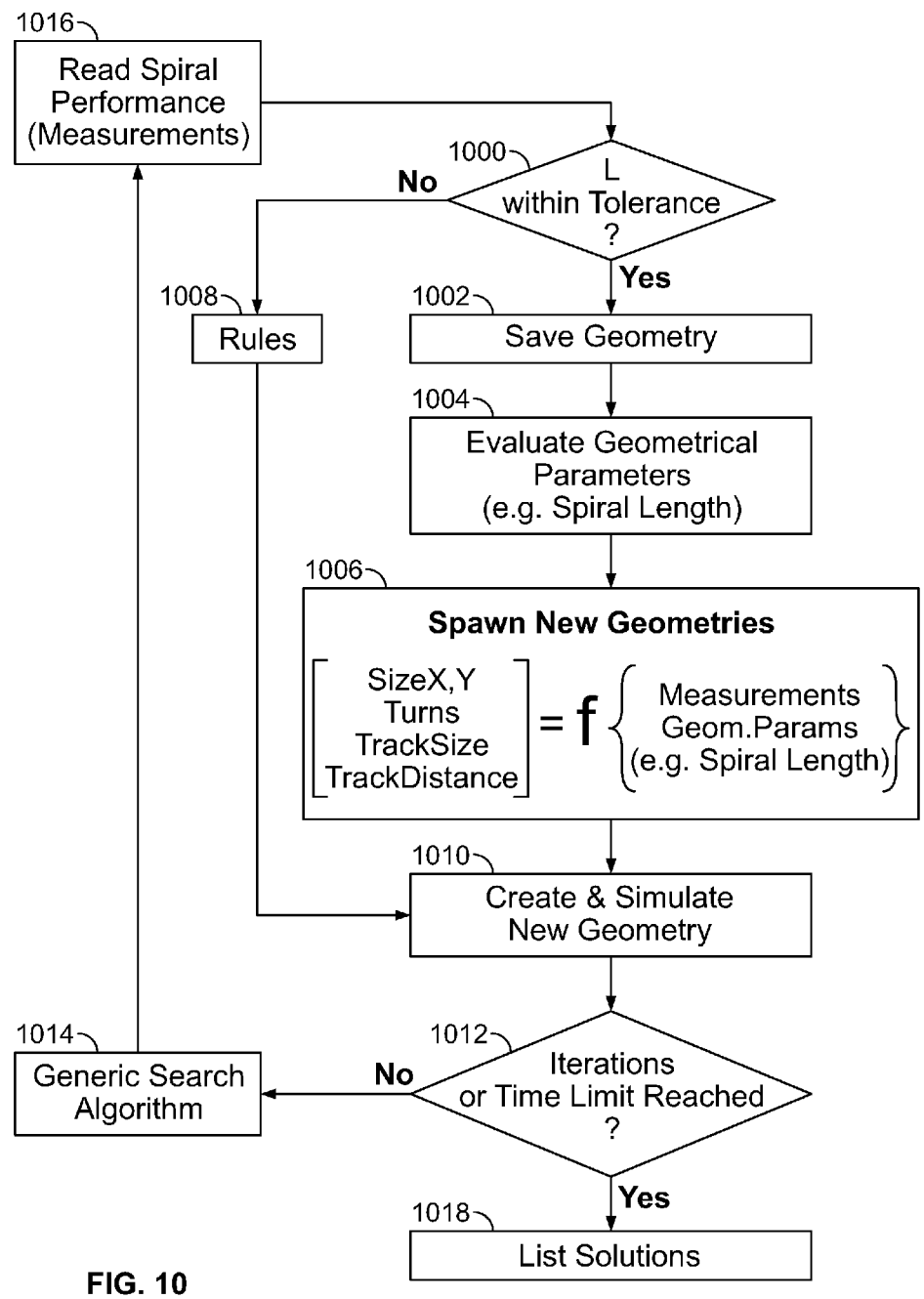
FIG. 10 is a flow chart of an algorithm of the "Q optimisation" mode in accordance with an embodiment.

To overcome these disadvantages, in one aspect of the invention, the HC algorithm is modified and extended, as illustrated in FIGS. 8, 9 and 10.

FIG. 8 is a flow chart of a search algorithm used in accordance with an embodiment. FIG. 8 includes: the step of read simulation result at step 800; evaluate a cost function Cf at step 802; determining if Cf_current<Cf_safe_state at step 804; evaluating new salience at step 806; clear CLOSE_SET at step 808; QUICK CONVERGENCE at step 810; setting safe state to current state at step 812; evaluating new salience of rule for a no condition at step 814; CLOSE_SET update at step 816; SMART_DISABLE at step 818; reloading safe state at step 820; functional mode processing at step 822; creating new geometry at step 824; and simulation at step 826.

As discussed with respect to FIGS. 8, 9 and 10, in accordance with an embodiment, an initial state may be a geometry situated in close proximity to the user's specifications and which may be drawn from a database. If none of the geometries of the aforementioned database is 'close enough' to the user's specifications, then a random geometry is chosen as the starting point. 'Close enough' is preferably defined, as any solution within ±20% of the self inductance value (L, measured in nH) at the frequency of interest $F_{des} \pm 1$ GHz, though other definitions may also be used. These solutions preferably also comply with the maximum size Constraint (in μm) set by the user. A random geometry on the other hand includes randomly selected geometric parameters.

In accordance with an embodiment, starting from an initial state, the generic search algorithm iterates steps 800 to 820 which alter the structure of the rule set including the salience values for certain rules which are activated. Each time the generic search algorithm is used, a functional mode is employed at step 822 for solution optimization, which leads to the creation of a new geometry at step 824 and its simulation at step 826. The search algorithm thereby runs in iterations with a functional mode, creation of a new geometry and simulation steps, in order to synthesize an optimal solution.

In accordance with an embodiment, the rules that may be used to transition from one state (i.e. solution) to the next preferably can be any of the 45 rules tabulated in Tables 2 and 3 (only the action items of the rules are presented), or in further embodiments similar rules. If the rules were all to be applied in a serial manner, as dictated by the HC algorithm, there would be 45 simulations needed before even deciding which is the next state. Clearly, such an implementation is inefficient. Instead, in accordance with an embodiment, a different approach is employed. A salience value is attributed to each rule depicting the success rate of a rule compared to the other rules. Whenever the rule set is triggered in the course of a functional mode, from a group of rules satisfying the execution conditions the one with the highest salience is preferably triggered. A new geometry is thus created; a geometry which will very likely lead to a state better than the previous one, given that the most 'successful' rule for the given circumstances was used.

In accordance with an embodiment, the results from the simulation of a new geometry are read at step 800 and the Cost Function (Cf) is calculated at step 802. An assessment of the just used rule follows:

In accordance with an embodiment, if this rule leads to a better state, i.e. Cf_current<Cf_safe_state, as calculated at step 804, then that rule is rewarded based on the yielded percentage improvement of the state at step 806. This current geometry and state is considered as the 'safe' state at step 812. As the rule is an improvement CLOSE_SET is cleared at step 808.

In accordance with an embodiment, if this rule did not lead to a better state, i.e. Cf_current>=Cf_safe_state, then that rule is penalized based on the yielded percentage worsening of the state at step 814. This rule is also added to the CLOSED_SET, i.e. a set of rules which have failed improving the current state, at step 816. The CLOSED_SET also helps avoiding formation of loops of the same non-effective rules. The CLOSED_SET rules remain deactivated until finding a rule, which will lead to a better than the current state. When that rule is found, the CLOSED_SET is flushed. In a preferred embodiment each time a rule fails, the safe state is recalled.

In accordance with an embodiment, to avoid unnecessary simulations, at step 818 another technique called SMART DISABLE may also be used; its purpose is to increase the convergence speed. Its function is better demonstrated in the following example: assume that L must be reduced; rule #31 (which has the max. salience value) is applied but fails. The rules under the same category (i.e. rules #28-34) having the next highest salience values would then be selected and applied in turn. However, since rule #31 was applied and failed it is certain that rules #32-34 will also fail. By adding rules #32-34 to the CLOSED_SET, we save time from 3 unneeded simulations. In accordance with an embodiment, preferably, this feature is not used in the case of rules affecting the number of turns, since this particular parameter has a major effect on the overall performance of the inductor.

In accordance with an embodiment, the convergence speed can be further increased with the use of another technique called QUICK CONVERGENCE at step 810. It is based on the following logic: when a certain rule fails, there is a possibility to transition to a better than the current state by giving highest priority of application to the immediately adjacent rule of the same category. The following example illustrates its function. Assume that L must be reduced; rule #37 (which has the max. salience value) is applied successfully. Rules #35-37 are added to the CLOSED_SET and absolute priority is given to rule #38. In accordance with an embodiment, if this rule is successful, the convergence rate will have been increased compared to re-using rule #37. In accordance with an embodiment, if it fails, rule #38 is placed in the CLOSED_SET and SMART DISABLE is used.

In accordance with an embodiment, the rule activation process can lead to a situation where there are no rules available for triggering. This situation is defined as dead-end (not shown). When the system detects such a situation then all the rules are reactivated in the hope of finding a way out of the dead-end. Preferably, if the system reaches a dead-end for the second time in the same design process, then the process is terminated to avoid further unnecessary simulations.

As described above with respect to FIG. 2, the user may select an optimization setting 212, such as 'Don't care' or 'Q optimization'. Accordingly, in accordance with an embodiment, two distinct functional modes of optimization (as per step 822 in FIG. 8) can be employed in the synthesis process: the 'Don't Care' mode and the 'Q Optimization' mode, which are described in the block diagrams of FIGS. 9 and 10 respectively.

FIG. 9 is a flow chart of an algorithm of the "Don't care" mode in accordance with an embodiment. FIG. 9 includes: determining if the self inductance value L is within a tolerance at step 900; looking for smaller geometries with the same spiral length at step 902; checking if such a geometry exists (e.g. if size is feasible) at step 904; triggering the rule set to modify this geometry at step 906; creating and simulating a new geometry at step 908; checking if stop conditions are reached at step 910; using the generic search algorithm at step 912 and listing the solutions at step 914.

With reference to FIG. 9 for the 'Don't care' functional mode, in accordance with an embodiment, the self inductance value L is compared with a tolerance value at step 900. If the value is within the tolerance value the process proceeds to steps 902 and 904 where smaller geometries with the same spiral length are instantiated if this is feasible, using an appropriate sizing method such as a parametric cell (pcell). In accordance with an embodiment, if no such geometry can be instantiated, e.g. because a design rule or pcell constraint would be violated, the system is assumed to have found the minimum value and the solutions are listed at step 914.

In accordance with an embodiment, if the geometry exists at step 904 or the inductance is not within a tolerance at step 900, rules are triggered at step 906, based on their current salience values as discussed with reference to FIG. 8. In accordance with an embodiment, the most salient rule leads to the creation of a new geometry and its simulation at step 908.

In accordance with an embodiment, once the simulation has been completed at step 908, the invention proceeds to step 910. At step 910, the invention checks if a predetermined stop condition has been met. In a preferred embodiment, such stop conditions may be a set number of reiterations, or a time limit. In further embodiments, other stop conditions may also be used.

In accordance with an embodiment, if the predetermined stop condition at step 910 has not been reached, the invention proceeds to step 912, where it performs the generic search algorithm. The generic search algorithm is described with reference to FIG. 8, in particular from step 800 to step 820. Therefore, in accordance with an embodiment, the invention will re-model the result of the simulation with the new geometric parameters. Once the modeling is complete, the invention proceeds back to step 900, where the inductance is compared with the pre-determined tolerance limit.

In accordance with an embodiment, if at step 910, the pre-determined stop condition has been reached the invention simply lists the solutions as determined at step 908, at step 914. Therefore, in accordance with an embodiment, the 'Don't care' optimization verifies if a smaller geometry with a similar spiral length is available or if the self inductance is not within pre-determined tolerance limits, and re-models accordingly.

FIG. 10 is a flow chart of an algorithm of the "Q optimization" mode in accordance with an embodiment. FIG. 10 includes: the step of determining whether the self inductance is within a tolerance limit at step 1000; saving the geometry at step 1002; evaluating the geometrical parameters such spiral length at step 1004; calculating new geometries at step 1006; triggering the rule set at step 1008; creating and simulating a new geometry at step 1010; checking if stop conditions are reached at step 1012; using the generic search algorithm at step 1014; reading the spiral performance measurement at step 1016; and listing solutions at step 1018.

In accordance with an embodiment, the process for the 'Q optimization' functional mode is somewhat different, since the invention aims to overcome the inherent difficulty in determining a global maximum as discussed above. With reference to FIG. 10, in accordance with an embodiment, at step 1000 the self inductance L is compared with a pre-determined tolerance value. If the self inductance value L is not within the specified tolerance at step 1000, the process proceeds onto step 1008. As described previously with references to FIGS. 8 and 9, the invention triggers the rule set and determines the most salient rule to implement for achieving an inductance value closer to the target.

In accordance with an embodiment, if the self inductance L is within the pre-determined tolerance value the process proceeds to step 1002. At step 1002, the present geometry is saved for later listing as a fit solution at step 1018. At step 1004, the invention evaluates the new geometrical parameters according to the saved geometry. Such parameters can include spiral length, maximum size, track sizes, orientation etc. At step 1006, the invention creates a new geometry based on the evaluated geometrical parameters and preferably based on measurements obtained from latest simulations. The function employed to spawn the new geometry at step 1006 can preferably be implemented as a rule in the rule set, providing further flexibility for passing expert knowledge in the system. In accordance with an embodiment, preferably, such a function and rule will ensure that consecutively larger sizes of inductors will be spawned and evaluated (within a user-specified maximum size constraint), thereby efficiently exploring the design space for the best possible trade-off of Q vs. size.

In accordance with an embodiment, once the new geometries have been determined either through the newly generated geometries at step 1006, or via the rules engine at step 1008, the invention proceeds to create and simulate the new geometry at step 1010. The step of creating and simulating the new geometries is as described above with reference to FIGS. 8 and 9. In accordance with an embodiment, once the simulation has been completed, the invention proceeds to step 1012 where the invention determines if a pre-determined stop condition such as iterations or time limit has been reached. If the pre-determined stop condition has been reached, the invention proceeds onto step 1018 and lists the solutions.

In accordance with an embodiment, if the pre-determined stop condition has not been reached the invention proceeds to step 1014, and performs the generic search algorithm. The generic search algorithm is as described with reference to FIG. 8. Once the generic search algorithm is complete, the invention proceeds onto step 1016 where the invention reads the spiral performance measurements and thereby determines the new value of the self inductance.

In accordance with an embodiment, the 'Q optimization' process differs from the 'Don't care' optimization process at least by spawning new geometries when the value of self inductance L is within the tolerance as at step 1000, as opposed to simply ending the process as shown as with reference to FIG. 9.

In accordance with an embodiment, this method achieves an efficient exploration of the design space for global maximum Q and avoids entrapment in local maxima, which is one of the known problems of the conventional HC algorithm. In accordance with an embodiment, this has been determined by comparing the results of the invention, to an extensive pre-constructed database of solutions; embodiments of the invention consistently succeed in synthesizing a solution that matches the best Q in the database for a given L and frequency, while completing synthesis at a small fraction of the time taken to construct the database (indicatively, in 3-20 minutes compared to 5 days).

In accordance with an embodiment, a mode of operation described as 'Q>GivenValue' may be defined. This mode is similar to 'Q Optimization' mode. In accordance with an embodiment, in this mode the expert system terminates the optimization process when it finds the first geometry with quality factor greater than the GivenValue.

Besides the optimization modes described herein, it should be straightforward for someone skilled in the art to use the methods of the invention for implementing additional optimization modes, for spiral inductors as well as other integrated components or even circuits, that need to be synthesized, optimized or sized.

In accordance with a preferred embodiment, the expert system may be configured to memorize the intermediate generated geometries of the synthesis process. This feature speeds up the search algorithm, avoiding iterations on designs that failed previously.

Figure 11:
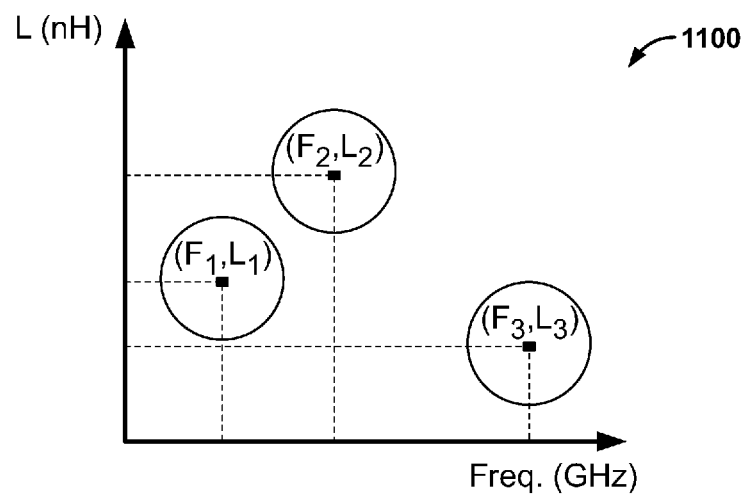
FIG. 11 shows a diagram of a design space for synthesis of inductors in accordance with an embodiment.

FIG. 11 shows a diagram of a design space for synthesis of inductors in accordance with an embodiment. In another preferred embodiment of the invention, the expert system may store the final salience values of any and all rules for each distinct design space 1100. In accordance with an embodiment in the design space the pair of values $<L_i, F_i>$ is defined, where $L_i$ is the desired inductance value in nH and $F_i$ is the operational frequency in GHz, as depicted in FIG. 11. When the user specifies a spiral with $<L_{nominal}, F_{nominal}>$ values, the expert system loads the salience values from a stored record which is similar to these values, using a suitable similarity metric (e.g. geometric radius). In case a stored record is not found that is similar enough, a new record with $<L_{nominal}, F_{nominal}>$ is created and the updated salience values are stored after the conclusion of search algorithm.

Figure 12:
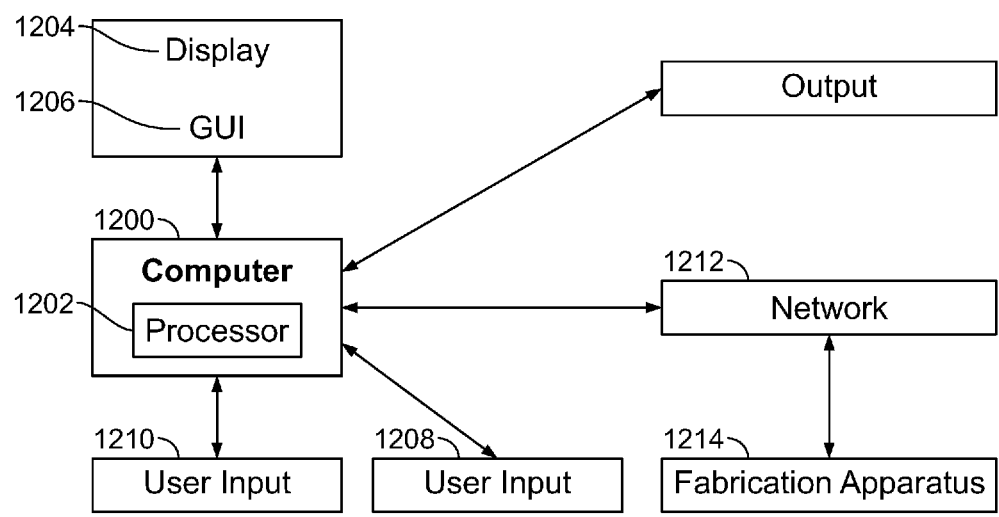
FIG. 12 shows a computer hardware system in accordance with an embodiment.

FIG. 12 shows a computer hardware system in accordance with an embodiment. The computer hardware system can include a computer 1200, having a processor 1202 such as microprocessor e.g. from Intel or Motorola for example, a display 1204 preferably enabling a graphical user interface 1206 in combination with user input devices 1208 and 1210, such as keyboard, mouse or other interactive device(s) to enable a user to interact with the processor 1202 via GUI 1206 for example to enable determination of the layout of a spiral inductor. Preferably the apparatus or system further comprise means to enable communication between computer 1200 and external devices such as a computer attached to a network 1212 or a fabrication apparatus 1214 such as an IC manufacturing line. Network 1212 might be a local area network LAN, or multiple interconnected networks including the Internet for example.

TABLE 2

Rules to increase L

| Rules to Increase L | | |
|---|---|---|
| # 1-5 | Turns | Turns += 0.25*Turns |
| | | Turns += 0.5*Turns |
| | | Turns += 1*Turns |
| | | Turns += 2*Turns |
| | | Turns += 3*Turns |
| # 6-14 | SizeX | SizeX += 0.01*SizeX |
| | | SizeX += 0.05*SizeX |
| | | SizeX += 0.1*SizeX |
| | | SizeX += 0.25*SizeX |
| | | SizeX += 0.5*SizeX |
| | | SizeX += 1*SizeX |
| | | SizeX += 3*SizeX |
| | | SizeX += 4*SizeX |
| | | SizeX += 5*SizeX |
| # 15-19 | TrackDistance | TrackDistance += 0.01*TrackDistance |
| | | TrackDistance += 0.05*TrackDistance |
| | | TrackDistance += 0.1*TrackDistance |
| | | TrackDistance += 0.25*TrackDistance |
| | | TrackDistance += 0.5*TrackDistance |
| # 20-24 | TrackSize | TracSize += 0.01*TrackSize |
| | | TracSize += 0.05*TrackSize |
| | | TracSize += 0.1*TrackSize |
| | | TracSize += 0.25*TrackSize |
| | | TracSize += 0.5*TrackSize |

TABLE 3

Rules to decrease L

| Rules to Decrease L | | |
|---|---|---|
| # 25-27 | Turns | Turns -= 0.25*Turns |
| | | Turns -= 0.5*Turns |
| | | Turns -= 1*Turns |
| # 28-34 | SizeX | SizeX -= 0.01*SizeX |
| | | SizeX -= 0.05*SizeX |
| | | SizeX -= 0.1*SizeX |
| | | SizeX -= 0.25*SizeX |
| | | SizeX -= 0.5*SizeX |
| | | SizeX -= 1*SizeX |
| | | SizeX -= 2*SizeX |
| # 35-39 | TrackDistance | TrackDistance -= 0.01*TrackDistance |
| | | TrackDistance -= 0.05*TrackDistance |
| | | TrackDistance -= 0.1*TrackDistance |
| | | TrackDistance -= 0.25*TrackDistance |
| | | TrackDistance -= 0.5*TrackDistance |
| # 40-45 | TrackSize | TracSize -= 0.01*TrackSize |
| | | TracSize -= 0.05*TrackSize |
| | | TracSize -= 0.1*TrackSize |
| | | TracSize -= 0.25*TrackSize |
| | | TracSize -= 0.5*TrackSize |
| | | TracSize -= 1*TrackSize |

The present invention may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. An apparatus for designing an electrical component in an integrated circuit, the apparatus comprising:
a user interface operable to receive input relating to a user-desired characteristic and an optimization target of the electrical component; and
a memory for storing data;
a processor operable to:

a) determine optimal characteristics of the electrical component to define the electrical component for fabrication in the integrated circuit,
b) combine the user-desired characteristic with preset characteristics of the electrical component,
c) define a computer-simulatable model of the electrical component in the integrated circuit,
d) simulate the electrical component with the computer-simulatable model having the combined characteristics to determine performance of the electrical component,
e) draw on a rule-set of one or more rules stored in the memory, the rules relating to user knowledge of dependency of at least one design criterion on another design criterion, said design criteria selected from one or more of a physical, geometrical or performance characteristic, in order to enable modification of the model, and
f) iterating through one or more simulations and modifications using the rule-set to determine a design solution for the electrical component, said iterating being performed as a function of a comparison of the design solution to the user-desired characteristic.

2. The apparatus according to claim 1, wherein the user-desired characteristic is inductance L at an operating frequency of an integrated spiral inductor.

3. The apparatus according to claim 1, wherein the optimization target is best possible quality factor Q of the electrical component.

4. The apparatus according to claim 1, wherein the at least one design criterion is a physical, geometrical or performance characteristic.

5. The apparatus according to claim 1, wherein:
the rule-set is initially determined based on knowledge and experience collected from several tests and optimization runs;
rules of the rule-set are graded relative to one another and are assigned a value reflecting said grading; and
the assigned value of specific rules in the rule-set is promoted or demoted based on efficiency of a rule in generating good candidate solutions for a given synthesis problem.

6. The apparatus according to claim 5, wherein the efficiency in generating good candidate solutions for a given synthesis problem is determined based on simulation of the model.

7. The apparatus according to claim 1, wherein the optimal characteristics include:
physical geometry including one or more of size, number of turns, conductor track width, track-to-track spacing and number of stacked metal layers; and
electrical performance specifications including one or more of inductance L and quality factor Q of an integrated spiral inductor.

8. The apparatus according to claim 1, wherein the processor includes a self-learning mechanism configured to self-learn by dynamically self-adjusting assigned grade value of rules in the rule-set after one or more simulation results become available, wherein rules with higher assigned grade value execute first and more frequently to modify the model.

9. The apparatus according to claim 8, wherein the rule-set initially incorporates rules and assigned grade value of rules based on user experience of performance estimates of a model under simulation.

10. The apparatus according to claim 9, wherein the user interface is operable to modify and insert new search and/or optimization rules in the rule-set, to allow the user to add expert knowledge to the rule-set, and wherein the self-learning mechanism operates on user-provided rules to dynamically adjust assigned grade value during operation with respect to pre-existing rules in the rule-set.

11. The apparatus according to claim 1, wherein the processor is configured to execute a heuristic search algorithm to find a solution, said algorithm avoiding blockage at local optima and determining global optima, and preferably uses an adapted hill climb algorithm.

12. The apparatus according to claim 5, wherein the assigned grade value values of any or all rules in the rule-set, which were last used in solving a particular synthesis problem, are stored in memory, and are subsequently recalled from memory to operate on a similar synthesis problem, thereby accelerating the operation, wherein problem similarity is determined based on similarity of desired electrical and/or geometrical characteristics between problems.

* * * * *